(12) United States Patent
Ittel et al.

(10) Patent No.: US 8,894,888 B2
(45) Date of Patent: Nov. 25, 2014

(54) CONDUCTIVE PASTE COMPOSITION WITH SYNTHETIC CLAY ADDITIVE AND ITS USE IN THE MANUFACTURE OF SEMICONDUCTOR DEVICES

(75) Inventors: Steven Dale Ittel, Wilmington, DE (US); John Graeme Pepin, Raleigh, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 357 days.

(21) Appl. No.: 13/332,611

(22) Filed: Dec. 21, 2011

(65) Prior Publication Data

US 2013/0161572 A1     Jun. 27, 2013

(51) Int. Cl.
*H01B 1/02* (2006.01)
*H01B 1/22* (2006.01)

(52) U.S. Cl.
USPC ............ 252/514; 252/182.1; 106/31.92; 106/287.17; 136/256; 423/331; 438/80

(58) Field of Classification Search
CPC .............................................. H01L 31/022425
USPC ............ 252/182.1, 514; 106/287.17, 31.92; 136/256; 423/331; 438/80
See application file for complete search history.

(56) References Cited

U.S. PATENT DOCUMENTS 3,671,190 A * 6/1972 Neumann et al. ............. 423/331
5,573,853 * 11/1996 Kondo ..................... 106/287.17
2009/0056798 A1 * 3/2009 Merchant et al. ............. 136/256
2009/0148484 A1 6/2009 Lin et al.
2012/0015472 A1 * 1/2012 Hayashi et al. ................. 438/80

FOREIGN PATENT DOCUMENTS

KR         803176 B1      2/2008
KR     1020100122604    * 11/2010   ............... H01B 1/22
WO     WO 2010-113708 A1 * 10/2010  ............. H01L 21/28

OTHER PUBLICATIONS

Majumdar, Debasis et al., Clay-polymer nanocomposite coatings for imaging application, Applied Clay Science, 2003, pp. 265-273, vol. 23.
Laponite Brochure, Performance Additives, Rockwood Additives Limited: A Rockwood Specialties Group, Inc. Company, Cheshire UK.

* cited by examiner

Primary Examiner — Khanh Tuan Nguyen

(57) ABSTRACT

A conductive paste composition contains a source of an electrically conductive metal, a fusible material, a synthetic clay additive, and an optional etchant additive, dispersed in an organic medium. An article such as a photovoltaic cell is formed by a process having the steps of deposition of the paste composition on a semiconductor substrate by a process such as screen printing and firing the paste to remove the organic medium and sinter the metal and fusible material. The synthetic clay additive aids in establishing a low resistance electrical contact between the front side metallization and underlying semiconductor substrate during firing.

11 Claims, 1 Drawing Sheet

CONDUCTIVE PASTE COMPOSITION WITH SYNTHETIC CLAY ADDITIVE AND ITS USE IN THE MANUFACTURE OF SEMICONDUCTOR DEVICES

FIELD OF THE INVENTION

The present invention relates to a conductive paste composition containing a synthetic clay additive that is useful in the fabrication of a variety of electrical and electronic devices including photovoltaic cells.

BACKGROUND OF THE INVENTION

A conventional photovoltaic cell incorporates a semiconductor structure with a junction, such as a p-n junction formed with an n-type semiconductor and a p-type semiconductor. For the typical p-base configuration, a negative electrode is located on the side of the cell that is to be exposed to a light source (the "front" side, which in the case of a solar cell is the side exposed to sunlight), and a positive electrode is located on the other side of the cell (the "back" side). Radiation of an appropriate wavelength, such as sunlight, falling on the p-n junction serves as a source of external energy that generates electron-hole pair charge carriers. These electron-hole pair charge carriers migrate in the electric field generated by the p-n junction and are collected by electrodes on respective surfaces of the semiconductor. The cell is thus adapted to supply electric current to an electrical load connected to the electrodes, thereby providing electrical energy converted from the incoming solar energy that can do useful work.

Industrial photovoltaic cells are commonly provided in the form of a structure, such as one based on a doped crystalline silicon wafer, that has been metalized, i.e. provided with electrodes in the form of electrically conductive metal contacts through which the generated current can flow to an external electrical circuit load. Most commonly, these electrodes are provided on opposite sides of a generally planar cell structure. For the typical p-base configuration, the negative electrode is located on the front side of the cell; the positive electrode is located on the back side.

Both electrodes are conventionally produced by applying suitable conductive metal pastes to the respective surfaces of the semiconductor body and thereafter firing the pastes.

Photovoltaic cells are commonly fabricated with an insulating layer on their front side to afford an antireflective property that maximizes the utilization of incident light. However, in this configuration, the insulating layer normally must be removed to allow an overlaid front-side electrode to make contact with the underlying semiconductor surface. The front-side conductive metal paste typically include a fusible material, a conductive species (e.g., silver particles), and an organic vehicle or medium. The electrode may be formed by depositing the paste composition in a suitable pattern by screen printing and thereafter firing it to dissolve or otherwise penetrate the insulating layer and sinter the metal powder, such that an electrical connection with the underlying semiconductor structure is formed.

The ability of the paste composition to penetrate the antireflective coating and form a strong bond with the substrate upon firing is highly dependent on the composition of the conductive paste and firing conditions. Efficiency, a key measure of photovoltaic cell performance, is also influenced by the quality of the electrical contact made between the fired conductive ink and the substrate.

Although various methods and compositions useful in forming devices such as photovoltaic cells are known, there nevertheless remains a need for compositions that permit fabrication of patterned conductive structures that provide improved overall device electrical performance and that facilitate the efficient manufacture of such devices.

SUMMARY OF THE INVENTION

The present invention relates to the need for semiconductor devices exhibiting improved electrical performance, such as photovoltaic cells whose performance is signaled by properties such as their efficiency in converting incident solar radiation to usable electrical power, and for processes for their manufacture.

An aspect of the invention provides a paste composition that comprises in admixture:
  a) about 70 to 96% by weight based on solids of a source of electrically conductive metal;
  b) about 0.1 to 15% by weight based on solids of a fusible material;
  c) about 0.1 to 2% by weight based on solids of a synthetic clay additive; and
  d) and 0 to about 15% by weight based on solids of one or more etchant additives; and
  e) an organic medium.

The synthetic clay additive in some embodiments of the foregoing paste composition is a synthetic smectite, such as a layered hydrous magnesium lithium silicate comprising particles of a compound having the approximate chemical formula:

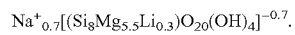

$$Na^+{}_{0.7}[(Si_8Mg_{5.5}Li_{0.3})O_{20}(OH)_4]^{-0.7}.$$

The synthetic clay may comprise particles having an average diameter in the range of 10 to 40 nm, or 20 to 30 nm and an average thickness in the range of 0.5 to 2.0 nm, or 0.6 to 1.5 nm. In further embodiments, the synthetic clay material additive is present at 0.1 to 1% by weight based on solids, or the synthetic clay material additive is present at 0.1 to 0.5% by weight based on solids.

Another aspect provides a process for forming an electrically conductive structure on a substrate comprising:
  (a) providing a substrate having a first major surface;
  (b) applying a paste composition onto a preselected portion of the first major surface, wherein the paste composition comprises:
    i) about 70 to 96% by weight based on solids of a source of an electrically conductive metal;
    ii) about 0.1 to 15% by weight based on solids of a fusible material,
    iii) 0 to about 15% by weight based on solids of one or more etchant additives, and
    iv) about 0.1 to 2% by weight based on solids of a synthetic clay additive, and
    v) an organic medium; and
  (d) firing the substrate and paste composition thereon, whereby the electrically conductive structure is formed on the substrate.

Still another aspect provides an article comprising a substrate and an electrically conductive structure thereon, the article having been formed by the foregoing process. In various embodiments, the substrate is a silicon wafer and the article comprises a photovoltaic cell.

BRIEF DESCRIPTION OF THE DRAWINGS

The invention will be more fully understood and further advantages will become apparent when reference is had to the following detailed description of the preferred embodiments of the invention and the accompanying drawings, wherein like reference numeral denote similar elements throughout the several views and in which.

DETAILED DESCRIPTION OF THE INVENTION

Figure 1A:
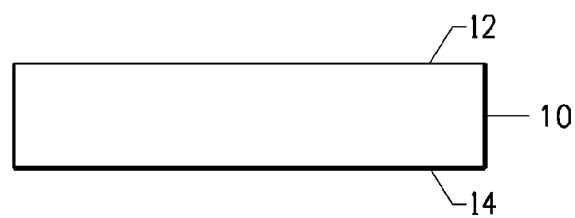
FIGS. 1A-1F depict successive steps of a process by which a semiconductor device may be fabricated.

Solar-powered photovoltaic systems are considered to be environmentally beneficial in that they reduce the need for fossil fuels. The present invention addresses the need for a process to manufacture high performance semiconductor devices having mechanically robust, high conductivity electrodes. The conductive paste composition provided herein is beneficially employed in the fabrication of front-side electrodes of photovoltaic devices, which must make good electrical contact despite the presence of a front-side insulating layer typically included.

In an aspect, this invention provides a paste composition that comprises: a functional conductive component, such as a source of electrically conductive metal; a fusible material; a synthetic clay additive; an optional etchant additive; and an organic medium.

The paste composition may comprise, in admixture, an inorganic solids portion comprising: (a) about 75% to about 99% by weight, or about 70 to about 88% by weight, of a source of an electrically conductive metal; (b) about 0.1% to about 15% by weight, or about 0.5% to about 8% by weight, or about 2% to about 8% by weight, or about 0.5 to about 5% by weight, or about 1 to about 3% by weight, of a fusible material; (c) about 0.1% to about 2% by weight of a synthetic clay additive; and (d) 0 to about 15% by weight, or about 0.1% to about 5% by weight, or about 0.1% to about 3% by weight, of one or more etchant additives, wherein the above stated contents are based on the total weight of all the constituents of the inorganic solids portion of the composition.

As further described below, the paste composition also comprises an organic medium, which acts as a carrier or vehicle for the inorganic constituents, which are dispersed therein. The paste composition may further include additional components such as surfactants, thickeners, thixotropes and binders.

The paste composition can be used to form a conductive electrode employed in an electrical or electronic device such as a photovoltaic cell or an array of such cells. In an embodiment, the conductive electrode is disposed as the front side electrode of a photovoltaic cell. Ideally, a paste composition is chosen that promotes the formation of a relatively low resistance contact between the front side metallization and the underlying semiconductor substrate. Suitable paste compositions are believed to aid in etching surface insulating layers often employed in semiconductor structures such as photovoltaic cells.

Alternatively, the composition can be used to form conductive traces, such as those employed in a semiconductor module that is to be incorporated into an electrical or electronic device. As would be recognized by a skilled artisan, the paste composition described herein can be termed "conductive," meaning that the composition can be formed into a structure and thereafter processed to exhibit an electrical conductivity sufficient for conducting electrical current between devices or circuitry connected to such a device.

Typically, electrodes and other conductive traces are provided by screen-printing the paste composition onto a substrate, although other forms of printing, such as plating, extrusion, inkjet, shaped or multiple printing, or ribbons, may also be used. After deposition, the composition, which typically comprises a conductive metal powder (e.g., Ag) in an organic carrier, is fired at an elevated temperature.

I. Inorganic Components

An embodiment of the present invention relates to a paste composition, which may include: an inorganic solids portion comprising a functional material providing electrical conductivity, a fusible material, a synthetic clay additive, one or more optional etchant additives, and an organic medium or vehicle in which the inorganic solids are dispersed. The paste composition may further include additional components such as surfactants, thickeners, thixotropes, and binders.

A. Electrically Conductive Metal

The present paste composition includes a source of an electrically conductive metal. Exemplary metals include silver, gold, copper, nickel, palladium, and alloys and mixtures thereof. Silver is preferred for its high conductivity and processability.

The conductive metal may be incorporated directly in the present paste composition as a metal powder. In another embodiment, a mixture of two or more such metals is directly incorporated. Alternatively, the metal is supplied by a metal oxide or salt that decomposes upon exposure to the heat of firing to form the metal. As used herein, the term "silver" is to be understood as referring to elemental silver metal, alloys of silver, and mixtures thereof, and may further include silver derived from silver oxide ($Ag_2O$) or silver salts such as AgCl, $AgNO_3$, $AgOOCCH_3$ (silver acetate), $AgOOCF_3$ (silver trifluoroacetate), $Ag_3PO_4$ (silver orthophosphate), or mixtures thereof. Any other form of conductive metal compatible with the other components of the paste composition also may be used.

Electrically conductive metal powder used in the present paste composition may be supplied as finely divided particles having any one or more of the following morphologies: a powder form, a flake form, a spherical form, a granular form, a nodular form, a crystalline form, other irregular forms, or mixtures thereof. The electrically conductive metal or source thereof may also be provided in a colloidal suspension, in which case the colloidal carrier would not be included in any calculation of weight percentages of the solids of which the colloidal material is part.

The particle size of the metal is not subject to any particular limitation. In various embodiments, the average particle size is greater than 0.2 microns and less than 10 microns, or the average particle size is greater than 0.4 microns and less than 5 microns. Particle sizes of the metal and other constituents of the composition described herein are measured using dynamic light scattering or laser diffraction, but other methods, such as microscopy, can also be used. Instruments for such measurements are commercially available, e.g., the Horiba Instruments Inc. (Irvine, Calif.) model LA-910 particle size analyzer.

The electrically conductive material may comprise any of a variety of percentages of the composition of the paste composition. To attain high conductivity in a finished conductive structure, it is generally preferable to have the concentration of the electrically conductive material be as high as possible while maintaining other required characteristics of the paste composition that relate to either processing or final use. In an embodiment, the silver or other electrically conductive material may comprise from about 70 to about 99%, or about 85 to about 99% by weight, or about 95 to about 99% by weight, of the solid components of the paste composition. In another embodiment, the solids portion of the paste composition may include about 80 to about 90 wt. % silver particles and about 1 to about 9 wt. % silver flakes. In an embodiment, the solids portion of the paste composition may include about 70 to about 90 wt. %. silver particles and about 1 to about 9 wt % silver flakes. In another embodiment, the solids portion of the paste composition may include about 70 to about 90 wt. % silver flakes and about 1 to about 9 wt. % of colloidal silver. In a further embodiment, the solids portion of the paste composition may include about 60 to about 90 wt. % of silver particles or silver flakes and about 0.1 to about 20 wt. % of colloidal silver.

The electrically conductive metal used herein, particularly when in powder form, may be coated or uncoated; for example, it may be at least partially coated with a surfactant to facilitate processing. Suitable coating surfactants include, for example, stearic acid, palmitic acid, a salt of stearate, a salt of palmitate, and mixtures thereof. Other surfactants that also may be utilized include lauric acid, oleic acid, capric acid, myristic acid, linolic acid, and mixtures thereof. Still other surfactants that also may be utilized include polyethylene oxide, polyethylene glycol, benzotriazole, poly(ethylene glycol)acetic acid and other similar organic molecules. Suitable counter-ions for use in a coating surfactant include without limitation hydrogen, ammonium, sodium, potassium, and mixtures thereof. When the electrically conductive metal is silver, it may be coated, for example, with a phosphorus-containing compound.

In an embodiment, one or more surfactants may be included in the organic medium in addition to any surfactant included as a coating of conductive metal powder used in the present paste composition.

As further described below, the electrically conductive metal can be dispersed in an organic medium that acts as a carrier for the metal phase and other constituents present in the formulation.

B. Fusible Material

The present paste composition includes a fusible material. The term "fusible," as used herein, refers to a material that becomes fluid upon heating, such as the heating employed in a firing operation. The fusible material used in the present composition is believed to assist in the partial or complete penetration of oxide or nitride insulating layers commonly present on a silicon semiconductor wafer during firing. As described herein, this at least partial penetration may facilitate the formation of an effective, mechanically robust electrical contact between a conductive structure manufactured using the present composition and the underlying silicon semiconductor of a photovoltaic device structure.

In some embodiments, the present fusible material is composed of one or more fusible subcomponents. For example, the fusible material may comprise a glass material, or a mixture of two or more glass materials. Glass material in the form of a fine powder, e.g., as the result of a comminution operation, is often termed "frit" and is readily incorporated in the present paste composition.

As used herein, the term "glass" refers to a particulate form of solid oxide or oxyfluoride that is at least predominantly amorphous, meaning that short-range atomic order is preserved in the immediate vicinity of any selected atom, that is, in the first coordination shell, but dissipates at greater atomic-level distances (i.e., there is no long range periodic order). Hence, the X-ray diffraction pattern of a fully amorphous material exhibits broad diffuse peaks, and not the well-defined, narrow peaks of a crystalline material. In the latter, the regular spacing of characteristic crystallographic planes gives rise to the peaks, whose position in reciprocal space is in accordance with Bragg's law. A glass material also does not show a substantial crystallization exotherm upon heating close to or above its glass transition temperature or softening point, $T_g$., which is defined as the second transition point seen in a differential thermal analysis (DTA) scan). In an embodiment, the softening point of glass material used in the present paste composition is in the range of 300 to 800° C.

It is also contemplated that the some or all of the fusible material may be composed of material that exhibits some degree of crystallinity. For example, in some embodiments, a plurality of oxides are melted together and quenched as set forth herein, resulting in a material that is partially amorphous and partially crystalline. As would be recognized by a skilled person, such a material would produce an X-ray diffraction pattern having narrow, crystalline peaks superimposed on a pattern of broad amorphous peaks. Alternatively, one or more constituents, or even substantially all of the fusible material, may be predominantly or even substantially fully crystalline. In an embodiment, crystalline material useful in the fusible material of the present paste composition may have a melting point of at most 800° C.

In an embodiment, the fusible material used in the present paste composition may be a glass that includes one or more of three groups of constituents: glass formers, intermediate oxides, and modifiers. Exemplary glass formers may have a high bond coordination and smaller ionic size; the glass formers may form bridging covalent bonds when heated and quenched from a melt. Exemplary glass formers include, but are not limited to: $SiO_2$, $B_2O_3$, $P_2O_5$, $V_2O_5$, and $GeO_2$, and the like. Intermediate oxides may be used to substitute glass formers, as recognized by one of skill in the art. Exemplary intermediate oxides include, but are not limited to: $TiO_2$, $Ta_2O_5$, $Nb_2O_5$, $ZrO_2$, $CeO_2$, $Gd_2O_3$, $SnO_2$, $Al_2O_3$, and $HfO_2$, and the like. Modifiers may have a more ionic nature, and may terminate bonds. The modifiers may affect specific properties, including reduction of glass viscosity and/or modification of glass wetting properties. Exemplary modifiers include, but are not limited to: oxides such as alkali metal oxides, alkaline earth oxides, PbO, CuO, CdO, ZnO, $Bi_2O_3$, $Ag_2O$, $MoO_3$, and $WO_3$, and the like.

The fusible material in the present paste composition may optionally comprise a plurality of separate fusible substances, such as one or more frits, or a substantially crystalline material with additional frit material.

In an embodiment, a first fusible subcomponent is chosen for its capability to rapidly digest an insulating layer, such as that typically present on the front surface of a photovoltaic cell; further the first fusible subcomponent may have strong corrosive power and low viscosity. A second fusible subcomponent is optionally included to slowly blend with the first fusible subcomponent to alter the chemical activity. Preferably, the composition is such that the insulating layer is partially removed but without attacking the underlying emitter diffused region, which would shunt the device, were the corrosive action to proceed unchecked. Such fusible materials may be characterized as having a viscosity sufficiently high to provide a stable manufacturing window to remove insulating layers without damage to the diffused p-n junction region of a semiconductor substrate. Ideally, the firing process results in a substantially complete removal of the insulating layer without further combination with the underlying Si substrate or the formation of substantial amounts of non-conducting or poorly conducting inclusions.

The fusible material of the present composition may also include a flux material, which is a substance that when heated aids, induces, or otherwise actively participates in wetting, fusion, and flow. For example, a flux material may facilitate the bonding of a conductive trace to the substrate or in sintering the conductive metal. A flux material may be added to other bulk materials, which are either crystalline or amorphous, to provide greater flow or fusion than the bulk material would itself experience at a selected temperature. A flux material may be fully amorphous, or it may exhibit some degree of crystallinity, such that its powder x-ray diffraction pattern may include either or both of a broad amorphous halo and sharp crystalline peaks that define characteristic interatomic distances in accordance with Bragg's law. In addition, heating an amorphous frit or flux material may cause it to become partially or fully devitrified. A frit material may have wetting, fusion, or flow properties similar to a crystalline flux material, and vice versa. A skilled person will thus recognize that there exists a continuum between fluxes and frits. Exemplary crystalline flux materials may be an oxide or non-oxide, and may comprise materials such as $PbF_2$, $BiF_3$, $Bi_2O_3$, or the like.

Certain embodiments of the present paste composition (including the fusible material contained therein) are lead-free. As used in the present specification and the subjoined claims, the term "lead-free" refers to a composition to which no lead has been specifically added (either as elemental lead or as a lead-containing alloy, compound, or other like substance), and in which the amount of lead present as a trace component or impurity is 1000 parts per million (ppm) or less. In some embodiments, the amount of lead present as a trace component or impurity is less than 500 parts per million (ppm), or less than 300 ppm, or less than 100 ppm. The minimization of lead in the present paste composition facilitates the disposal or recycling of devices constructed with the composition and mitigates the health hazard associated with the known toxicity of lead-bearing substances, such as the present composition. Surprisingly and unexpectedly, photovoltaic cells exhibiting desirable electrical properties, such as high conversion efficiency, are obtained in some embodiments of the present disclosure, notwithstanding previous belief in the art that substantial amounts of lead must be included in a paste composition to attain these levels.

Fusible material usable in the present paste composition may be produced by conventional glass making techniques and equipment. For the examples provided herein, the ingredients were weighed and mixed in the desired proportions and heated in a platinum alloy crucible in a furnace. The ingredients may be heated to a peak temperature (e.g., 800° C. to 1400° C., or 1000° C. to 1200° C.) and held for a time such that the material forms a melt that is substantially liquid and homogeneous (e.g., 20 minutes to 2 hours). The melt optionally is stirred, either intermittently or continuously. In an embodiment, the melting process results in a material wherein the constituent chemical elements are fully mixed at an atomic level. The molten material is then typically quenched in any suitable way including, without limitation, passing it between counter rotating stainless steel rollers to form 0.25 to 0.50 mm thick platelets, by pouring it onto a thick stainless steel plate, or by pouring it into water or other quench fluid. The resulting particles are then milled to form a powder or frit.

Other production techniques may also be used for the present fusible material. One skilled in the art of producing such materials might therefore employ alternative synthesis techniques including, but not limited to, melting in non-precious metal crucibles, melting in ceramic crucibles, sol-gel, spray pyrolysis, or others appropriate for making powder forms of glass.

The present fusible material is described herein as including percentages of certain components (also termed the elemental constituency). Specifically, the composition may be specified by denominating individual components that may be combined in the specified percentages to form a starting material that subsequently is processed, e.g., as described herein, to form a glass or other fusible material. Such nomenclature is conventional to one of skill in the art. In other words, the composition contains certain components, and the percentages of those components are expressed as percentages of the corresponding oxide or other forms. As recognized by one of ordinary skill in the art of glass chemistry, a certain portion of volatile species may be released during the process of making the fusible material. An example of a volatile species is oxygen. The skilled person would also recognize that a fusible material composition specified in this manner may alternatively be prepared by supplying the required anions and cations in requisite amounts from different components that, when mixed, yield the same overall composition. For example, in various embodiments, phosphorus could be supplied either from $P_2O_5$ or alternatively from a phosphate of one of the cations of the composition.

Although oxygen is typically the predominant anion in the fusible material of the present paste composition, some portion of the oxygen may be replaced by fluorine to alter certain properties, such as chemical, thermal, or rheological properties of the glass that affect firing. One of ordinary skill would recognize that embodiments wherein the glass composition contains fluorine can be prepared using fluoride anions supplied from a simple fluoride or an oxyfluoride. For example, the desired fluorine content can be supplied by replacing some or all of an oxide nominally specified in the composition with the corresponding fluoride of the same cation, such as by replacing some or all of the $Li_2O$, $Na_2O$, or $Bi_2O_3$ nominally included with the amount of LiF, NaF, or $BiF_3$ needed to attain the desired level of F content. Of course, the requisite amount of F can be derived by replacing the oxides of more than one of the fusible material's cations if desired. Other fluoride sources could also be used, including sources such as ammonium fluoride that would decompose during the heating in typical glass preparation to leave behind residual fluoride anions. Useful fluorides include, but are not limited to, $BiF_3$, $AlF_3$, NaF, LiF, $ZrF_4$, $TiF_4$, and $ZnF_2$.

It is known to those skilled in the art that a fusible material such as one prepared by a melting technique as described herein may be characterized by known analytical methods that include, but are not limited to: Inductively Coupled Plasma-Emission Spectroscopy (ICPES), Inductively Coupled Plasma-Atomic Emission Spectroscopy (ICP-AES), and the like. In addition, the following exemplary techniques may be used: X-Ray Fluorescence spectroscopy (XRF), Nuclear Magnetic Resonance spectroscopy (NMR), Electron Paramagnetic Resonance spectroscopy (EPR), Mossbauer spectroscopy, Electron microprobe Energy Dispersive Spectroscopy (EDS), Electron microprobe Wavelength Dispersive Spectroscopy (WDS), and Cathodoluminescence (CL). A skilled person could calculate percentages of starting components that could be processed to yield a particular fusible material, based on results obtained with such analytical methods.

The fusible materials described herein are not limiting; it is contemplated that one of ordinary skill in the art of glass chemistry could make minor substitutions of additional ingredients and not substantially change the desired properties of the fusible material composition, including its interaction with a substrate and any insulating layer thereon.

A skilled person would recognize that the choice of raw materials could unintentionally include impurities that may be incorporated into the fusible material during processing. For example, the impurities may be present in the range of hundreds to thousands of parts per million. Impurities commonly occurring in industrial materials used herein are known to one of ordinary skill.

The presence of the impurities would not alter the properties of the fusible material itself, paste compositions made with the fusible material, or a fired device manufactured using the paste composition. For example, a solar cell employing a conductive structure made using the present paste composition may have the efficiency described herein, even if the composition includes impurities.

The fusible material preferably has a particle size that does not impede screen printing of the present paste to provide the features of the desired conductive structure. In an embodiment, a median particle size of the fusible material in the present composition may be in the range of about 0.5 to 10 μm, or about 0.8 to 5 μm, or about 1 to 3 μm.

In an embodiment, the amount of fusible material may be in the range of 0.5 to 8 wt. %, 1 to 6 wt. %, 1 to 4 wt. %, 1.5 to 2.5 wt. %, or 2 to 5 wt. %, of the total paste composition.

C. Synthetic Clay Additive

The properties of the present paste composition are enhanced by the inclusion of a synthetic clay additive material. As used herein, the term "synthetic clay material" refers to any form of silicate material having a 2:1 layered structure and synthesized by chemical processes. The 2:1 layered structure is formed by two layers, in which silicon is tetrahedrally coordinated by oxygens, surrounding an intermediate layer, in which a cation (usually a metal) is octahedrally coordinated by oxygens. In an embodiment, useful synthetic clay materials may have atomic structure and composition similar to that of the natural clay mineral hectorite (smectite).

Processes for synthesis of synthetic clay materials include those delineated in U.S. Pat. No. 6,890,502 to Bauer et al., which reference is incorporated herein in the entirety for all purposes by reference thereto.

One form of synthetic clay material found useful in the present composition is available commercially from Southern Clay Products division of Rockwood Additives, Gonzales, Tex., under the trade name Laponite®.

As best understood, Laponite® refers generally to a synthetic, 2:1 layered hydrous magnesium lithium silicate with the approximate empirical chemical formula:

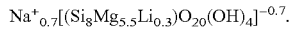

$Na^+{}_{0.7}[(Si_8Mg_{5.5}Li_{0.3})O_{20}(OH)_4]^{-0.7}$.

Some grades of Laponite are fluorinated by at least partial substitution of fluorine atoms for hydroxyl groups. Additionally or alternatively, the surface activity of the particles may be altered, e.g. by the addition of an alkali metal pyrophosphate, such as tetrasodium pyrophosphate ($Na_4P_2O_7$). Laponite materials are available in a variety of grades, including Laponite-RD, B, RDS, S482, XLG, XLS, D, DF, DS, S, JS, S482 and SL25. Laponite RD is preferred for the present paste composition.

It will be understood that the exact composition and particle morphology of materials produced by the hydrothermal processes typically used to form materials of this class depends strongly on process parameters such as time, temperature, pressure, and pH. Consequently, there is ordinarily some variability in the precise composition and morphology that results, even within a single lot of material. Thus, it is to be understood that the formulas given herein for synthetic clay materials are approximate representations, as there is typically some variation in the precise atomic ratios of the constituents given. Notwithstanding this variability, the materials are to be understood as having the composition represented by the particular formulas set forth herein.

Laponite particles typically have a generally disc-like or platelet-like morphology with approximate dimensions 25 nm diameter and 1 nm thickness. In most known commercial applications, Laponite materials are typically used in aqueous formulations, in which the water promotes dispersion and exfoliation of the layer structure and rheological modification of the formulation. In contrast, the present paste composition uses a non-aqueous organic medium. Thus, Laponite particles used in the paste composition must be dispersed by mechanical mixing, and interaction mechanisms based on the presence of water are not operative.

An embodiment of the present invention relates to a paste composition which contains synthetic clay material additive powders, which may be present in the composition in the range of 0.1 to 2 weight percent total composition. In one embodiment, the synthetic clay additive may be present in the range of 0.1 to 1 weight percent of the inorganic solids portion of the composition. In still a further embodiment, the synthetic clay additive may be present in the range of 0.1 to 0.5 weight percent total composition.

The surfaces of the synthetic clay particles used may optionally be treated with organic molecules including surfactants, polymeric ionomers and other surface-active materials.

In an embodiment of the invention, the synthetic clay material may be milled into the paste composition subsequent to the milling of all of the other components. In a further embodiment, the paste composition may be prepared by first combining and mixing all of the organic components, including organic thixotropes, allowing them to age for more than 24 hours and then mixing in the inorganic components including the synthetic clay material, before finally milling the paste.

It is known that some clay materials, including nanoscale synthetic clay materials, can act as thixotropes in aqueous and non-aqueous suspensions. The synthetic clay materials used in the present paste composition may inherently impart some degree of thixotropy, but it is believed that the effect, if any, on the paste's rheology is significant at most for the printing process itself. Thus, it is also believed the beneficial effects on the electrical and mechanical properties seen in articles that employ conductive structures formed using the present pastes go well beyond any benefit solely attributable to modification of thixotropy. Instead, the presence of the synthetic clay materials provides an unexpected and unexplained improvement in the final electrical properties of the resulting devices. Such improvement is not observed with paste compositions that use other inorganic thixotropic materials to provide the same level of thixotropy.

The present inventors are not aware of any chemical or physical association between the synthetic clay particles and the conductive metal particles in the present paste composition. The beneficial improvement in electrical properties is seen, even though the respective constituents may be prepared independently and then mixed into the final paste formulation as independent species. The inventors have further observed that inclusion of the clay particles does not result in any increased tendency for coagulation of the paste composition during storage. It is believed that this stability is evidence that there is no significant interaction between the metal and clay particles occurring over time. The silver particles have not been observed to precipitate onto the surface of the synthetic clay particles, nor is there known any particular ionic association that would lead to their agglomeration. Furthermore, the improvement is seen even though the clay particles are present in the system at weight percents that are a small fraction of that of the conductive or silver particles.

D. Etchant Additive(s)

In some embodiments, the present paste composition separately includes at least one discrete etchant additive, which may be at least one of a metal, a metal oxide, or a precursor compound, wherein: (a) the metal is at least one of Zn, Li, Ag, Mg, Gd, Ce, Zr, Ti, Mn, Sn, Ru, Co, Fe, Cu, and Cr, or a mixture or alloy thereof; (b) the oxide is an oxide of one or more of the foregoing metals; and (c) the precursor compound is a substance adapted to react upon firing to form one of the foregoing metals or metal oxides. Compounds that can generate metal oxides of Zn, Li, Ag, Mg, Gd, Ce, Zr, Ti, Mn, Sn, Ru, Co, Fe, Cu, or Cr upon firing include, but are not limited to, resinates, octoates, soaps, organic functional units, and the like. Some embodiments of the paste composition comprise plural etchant additives of the foregoing types.

Although certain of the foregoing metal oxides used as etchant additives are known as constituents of some oxide glasses, their separate inclusion in the present paste composition as discrete additives is believed to improve the kinetics of the etching of the insulating layer.

In an embodiment of the present paste composition, the particle sizes of the metal particles and etchant additives are not subject to any particular limitation. For example, an average particle size may be less than 10 microns, or less than 5 microns. Alternatively, the average particle size may be from 0.1 to 1.7 microns, from 0.6 to 1.3 microns, or from 7 to 100 nm. In an embodiment, $MnO_2$ and $TiO_2$ may be utilized as the etchant additive with an average particle size range of 7 nanometers (nm) to 125 nm, as specified by the median particle size ($d_{50}$). In a further embodiment, the particle size of the etchant additive can be at the atomic or molecular level when an organo-metallic compound such as a metal resinate or soap is used.

In another embodiment, the discrete etchant additive may be a Zn-containing additive. The Zn-containing etchant additive may, for example, one or more of (a) Zn and particularly nano-zinc, (b) a metal oxide of Zn, (c) any compound that can generate a metal oxide of Zn upon firing, or (d) a mixture thereof.

In one embodiment, the Zn-containing additive is ZnO, wherein the ZnO may have an average particle size in the range of 10 nanometers to 10 microns, or 40 nanometers to 5 microns. In a further embodiment, the ZnO may have an average particle size of 60 nanometers to 3 microns. In yet a further embodiment, the Zn-containing additive may have an average particle size of less than 0.1 microns. In particular the Zn-containing additive may have an average particle size in the range of 7 nanometers to less than 100 nanometers.

In an embodiment, the Zn-containing etchant additive (for example Zn, Zn resinate, or Zn soap) may be present in the total thick film composition in the range of 0 to 15 weight percent. In a further embodiment, the Zn-containing etchant additive may be present in the range of 2 to 10 weight percent total composition. In an embodiment, ZnO may be present in the composition in the range of 4 to 8 weight percent total composition.

It is presently believed that the presence of an etchant additive enhances the effect of the synthetic clay additive in promoting penetration of the insulating layer during firing, thereby resulting in improved electrical and mechanical properties of conductive structures produced using the present paste composition.

II. Organic Medium

The inorganic components of the present composition are typically mixed with an organic medium to form a relatively viscous material referred to as a "paste," which has a consistency and rheology that render it suitable for printing processes such as screen printing. The mixing is typically done with a mechanical system, and the constituents may be combined in any order, as long as they are uniformly dispersed and the final formulation has characteristics such that it can be successfully applied during end use.

A wide variety of inert, non-aqueous materials can be used in the organic medium of the present paste composition. By "inert" is meant a material that may be removed by a firing operation without leaving any substantial residue that is detrimental to final conductor line properties. Solvents useful in the organic medium include, without limitation, ester alcohols and terpenes such as alpha- or beta-terpineol or mixtures thereof with other solvents such as kerosene, dibutylphthalate, butyl carbitol, butyl carbitol acetate, hexylene glycol, and high-boiling alcohols and alcohol esters. A preferred ester alcohol is the monoisobutyrate of 2,2,4-trimethyl-1,3-pentanediol, which is available commercially from Eastman Chemical, Kingsport, Tenn., as Texanol®. In addition, volatile liquids for promoting rapid hardening after application of the paste onto the substrate can be included in the vehicle. Various combinations of these and other solvents are formulated to obtain the viscosity and volatility requirements desired.

Further ingredients optionally may be incorporated in the organic vehicle, such as thickeners, stabilizers, and/or other common additives known in screen-printing media. The organic medium may be a solution of one or more polymers in a solvent. Additionally, effective amounts of additives, such as surfactants or wetting agents, may be a part of the organic medium. This surfactant may be present in addition to any surfactant included as a coating on the conductive metal powder of the paste composition. Suitable wetting agents include phosphate esters and soya lecithin. Both inorganic and organic thixotropes may also be present.

Ideally, the inorganic components are dispersible in the organic medium with a stability that is compatible not only with the requisite manufacturing, shipping, and storage, but also with conditions encountered during deposition, e.g. by a screen printing process. Among the properties beneficially provided by the composition are stable and uniform dispersion of solids, appropriate viscosity and thixotropy for screen printing, appropriate wettability of the paste solids and the substrate on which printing will occur, a rapid drying rate after deposition, and stable firing properties.

A polymer frequently used for the formation of printable conductive metal pastes is ethyl cellulose. Other exemplary polymers that may be used include ethylhydroxyethyl cellulose, wood rosin and derivatives thereof, mixtures of ethyl cellulose and phenolic resins, cellulose acetate, cellulose acetate butyrate, poly(methacrylate)s of lower alcohols, and monoalkyl ethers of ethylene glycol monoacetate can also be used.

Any of these polymers may be dissolved in a suitable solvent, including those described herein. In an embodiment, the organic medium comprises about 2 wt. % to about 11 wt. % of one or more polymers. The polymer thus represents about 0.1 wt. % to about 5 wt. % of the total paste composition.

The preferred ratio of organic medium in the paste composition to the inorganic components in the dispersion can vary in accordance with the method of applying the paste and the kind of organic medium used. Usually, the dispersion will contain 70-95 wt. % of inorganic components and 5-30 wt. % of organic medium (vehicle) in order to obtain good wetting.

Among the commonly used organic thixotropic agents are hydrogenated castor oil and derivatives thereof. It is, of course, not always necessary to incorporate a thixotropic agent since the solvent and resin properties coupled with the shear thinning inherent in any suspension may alone be suitable in this regard. Suitable wetting agents include phosphate esters and soya lecithin.

III. Formation of Conductive Structures

An aspect of the invention provides a process that may be used to form a conductive structure on a substrate. The process generally comprises the steps of providing the substrate, applying a paste composition, and firing the substrate. Ordinarily, the substrate is planar and relatively thin, thus defining first and second major surfaces on its opposite sides.

Application

The present composition can be applied as a paste onto a preselected portion of a major surface of substrate, in a variety of different configurations or patterns. The preselected portion may comprise any fraction of the total first major surface area, including substantially all of the area. In an embodiment, the paste is applied on a semiconductor substrate, which may be single-crystal, multicrystal, or polycrystalline silicon, or other semiconductor materials.

The application can be accomplished by a variety of deposition processes, including printing. Exemplary deposition processes include, without limitation, screen printing, plating, extrusion, inkjet, shaped, multiple, or ribbon printing. The paste composition ordinarily is applied over any insulating layer present on the first major surface of the substrate.

The conductive composition may be printed in any useful pattern. For example, the electrode pattern used for the frontside of a photovoltaic cell commonly includes a plurality of narrow grid lines connected to one or more bus bars. Such a pattern permits the generated current to be extracted without undue resistive loss, while minimizing the area of the front side obscured by the metallization, which reduces the amount of incoming light energy that cannot be converted to electrical energy. Ideally, the features of the electrode pattern should be well defined, with a preselected thickness and shape, and have high electrical conductivity and low contact resistance with the underlying structure.

Conductors formed by printing and firing a paste such as that provided herein are often denominated as "thick film" conductors, since they are ordinarily substantially thicker than traces formed by atomistic processes, such as those used in fabricating integrated circuits. For example, thick film conductors may have a thickness after firing of about 1 to 100 μm. Consequently, paste compositions that in their processed form provide conductivity and are suitably applied using printing processes are often called "thick film pastes" or "conductive inks."

Firing

A firing operation may be used in the present process to effect a substantially complete burnout of the organic medium binder materials from the deposited paste. The firing typically involves volatilization and/or pyrolysis of the organic materials. A drying operation optionally precedes the firing operation, and is carried out at a modest temperature to harden the paste composition by removing its most volatile organics.

The firing process is believed to remove the organic medium, sinter the conductive metal in the composition, and establish electrical contact between the semiconductor substrate and the fired conductive metal. Firing may be performed in an atmosphere composed of air, nitrogen, an inert gas, or an oxygen-containing mixture such as a mixed gas of oxygen and nitrogen.

In one embodiment, the burn-out temperature for the firing may in the range between about 300° C. to about 1000° C., or about 300° C. to about 525° C., or about 300° C. to about 650° C., or about 650° C. to about 1000° C. The firing may be conducted using any suitable heat source. In an embodiment, the firing is accomplished by passing the substrate bearing the printed paste composition pattern through a belt furnace at high transport rates, for example between about 100 to about 500 centimeters per minute, with resulting hold-up times between about 0.05 to about 5 minutes. Multiple temperature zones may be used to control the desired thermal profile, and the number of zones may vary, for example, between 3 to 11 zones. The temperature of a burn-out operation conducted using a belt furnace is conventionally specified by the furnace set point in the hottest zone of the furnace, but it is known that the peak temperature attained by the passing substrate in such a process is somewhat lower than the highest set point. Other batch and continuous rapid fire furnace designs known to one of skill in the art are also contemplated.

Insulating Layer

In some embodiments of the invention, the paste composition is used in conjunction with a substrate, such as a semiconductor substrate, having an insulating layer present on one or more of the substrate's major surfaces. The layer may comprise one or more components selected from aluminum oxide, titanium oxide, silicon nitride, $SiN_x$:H (silicon nitride containing hydrogen for passivation during subsequent firing processing), silicon oxide, and silicon oxide/titanium oxide, and may be in the form of a single, homogeneous layer or multiple sequential sub-layers of any of these materials. Silicon nitride is widely used. The insulating layer may be applied by methods including CVD, PCVD, sputtering or other methods known to one of skill in the art.

In some embodiments of the invention, the insulating layer provides the cell with an anti-reflective property, which lowers the cell's surface reflectance of light incident thereon, thereby improving the cell's utilization of the incident light and increasing the electrical current it can generate. Thus, the insulating layer is often denoted as an anti-reflective coating (ARC). The composition and thickness of the layer are preferably chosen to maximize the antireflective property in accordance with the layer material's refractive index. In some embodiments, the deposition processing conditions are adjusted to vary the stoichiometry of the layer, thereby altering properties such as the refractive index to a desired value. For a silicon nitride layer with a refractive index of about 1.9 to 2.0, a thickness of about 700 to 900 Å (70 to 90 nm) is suitable.

In an embodiment, the insulating layer may be deposited on the substrate by methods known in the microelectronics art, such as any form of chemical vapor deposition ("CVD") including plasma-enhanced CVD ("PECVD") or thermal CVD, thermal oxidation, or sputtering. In another embodiment, the substrate is coated with a liquid material that under thermal treatment decomposes or reacts with the substrate to form the insulating layer. In still another embodiment, the substrate is thermally treated in the presence of an oxygen- or nitrogen-containing atmosphere to form an insulating layer. Alternatively, no insulating layer is specifically applied to the substrate, but a naturally forming substance, such as silicon oxide on a silicon wafer, may function as an insulating layer.

The present method optionally includes the step of forming the insulating layer on the semiconductor substrate prior to the application of the paste composition.

In various embodiments, a portion of any insulating layer present, whether specifically applied or naturally-occurring, may be removed to enhance electrical contact between the paste composition and the underlying semiconductor substrate. Preferably, the fusible material, synthetic clay additive, and the optional etchant additive act in concert to at least partially dissolve the insulating layer to permit contact to be established.

In some implementations of the present process, the paste composition is applied over any insulating layer on the substrate. In this instance, the fusible material and additives of the paste are believed to combine with or otherwise penetrate some or all of the thickness of the insulating layer material during firing. The firing results in a secure attachment of the conductive metal to the substrate. Ideally, a metallurgical bond is formed over substantially all the area of the substrate covered by the conductive element. Firing also promotes the formation of good electrical conductivity in the conductive element itself and a low surface resistance connection to the substrate. While electrical contact may be limited to conductive domains dispersed over the printed area, it is preferred that the contact be uniform over substantially the entire area.

Structures

An embodiment of the present invention relates to a structure comprising a substrate and a conductive electrode, which may be formed by the process described above.

In a further embodiment, the substrate may be a semiconductor substrate, which may include an insulating layer comprised of one or more thin layers on at least its first major surface.

The structures described herein may be useful in the manufacture of semiconductor devices, including photovoltaic devices. An embodiment of the invention relates to a semiconductor device containing one or more structures described herein; an embodiment of the invention relates to a photovoltaic device containing one or more structures described herein; an embodiment of the invention relates to a photovoltaic cell containing one or more structures described herein; an embodiment of the invention relates to a solar panel containing one or more structures described herein.

Semiconductor Device Manufacture

In another aspect, the present invention relates to a device, such as an electrical, electronic, semiconductor, or photovoltaic device. Various embodiments of the device include a junction-bearing semiconductor substrate and an insulating layer, such as a silicon nitride layer, present on a first major surface of the substrate. One possible sequence of steps implementing the present process for manufacture of a photovoltaic cell device is illustrated in FIGS. 1A-1F.

FIG. 1A shows a p-type substrate 10, which may be a single crystal, multicrystalline, or polycrystalline silicon. Substrate 10 may be sliced, for example, from an ingot that has been formed from a pulling or casting process. Surface damage, e.g. from slicing with a wire saw, and contamination may be removed by etching away about 10 to 20 μm of the substrate surface using an aqueous alkali solution such as aqueous potassium hydroxide or aqueous sodium hydroxide, or using a mixture of hydrofluoric acid and nitric acid. In addition, a step in which the substrate is washed with a mixture of hydrochloric acid and hydrogen peroxide may be added to remove heavy metals such as iron adhering to the substrate surface. Substrate 10 has a first major surface (front side) 12 that is textured to reduce light reflection. Texturing may be produced by etching a major surface with an aqueous alkali solution such as aqueous potassium hydroxide or aqueous sodium hydroxide. Substrate 10 has a second major surface (back side) 14.

Figure 1B:
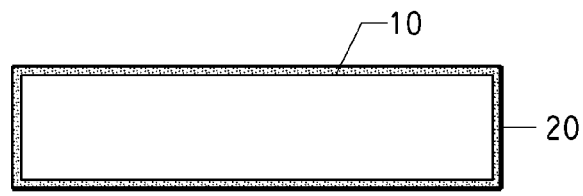

In FIG. 1B, an n-type diffusion layer 20 is formed to create a p-n junction with p-type material below. The n-type diffusion layer 20 can be formed by any suitable doping process, such as thermal diffusion of phosphorus (P) provided from phosphorus oxychloride ($POCl_3$). In the absence of any particular modifications, the n-type diffusion layer 20 is formed over the entire surface of the silicon p-type substrate. The depth of the diffusion layer can be varied by controlling the diffusion temperature and time, and is generally formed in a thickness range of about 0.3 to 0.5 microns. The n-type diffusion layer may have a sheet resistivity from several tens of ohms per square up to about 120 ohms per square.

Figure 1C:

After protecting one surface of the n-type diffusion layer 20 with a resist or the like, the n-type diffusion layer 20 is removed from most surfaces by etching so that it remains only on the first major surface 12 of substrate 10, as shown in FIG. 1C. The resist is then removed using an organic solvent or the like.

Figure 1D:
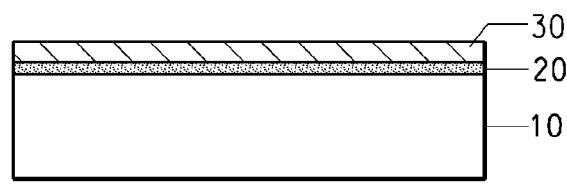

Next, as shown in FIG. 1D, an insulating layer 30, which also functions as an antireflective coating, is formed on the n-type diffusion layer 20. The insulating layer is commonly silicon nitride, but can also be other a layer of another material, such as $SiN_x:H$ (i.e., the insulating layer comprises hydrogen for passivation during subsequent firing processing), titanium oxide, silicon oxide, mixed silicon oxide/titanium oxide, or aluminum oxide. The insulating layer can be in the form of a single layer or multiple layers.

Figure 1E:
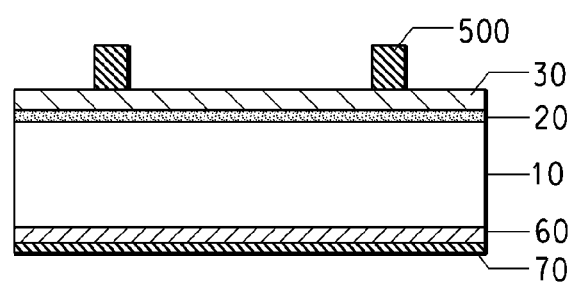

Next, electrodes are formed on both major surfaces 12, 14 of the substrate. As shown in FIG. 1E, a paste composition 500 of this invention is screen-printed on the insulating layer 30 and then dried. For a photovoltaic cell, paste composition 500 is typically applied in a predetermined pattern of conductive lines extending from one or more bus bars that occupy a predetermined portion of the surface. In addition, aluminum paste 60 and back-side silver paste 70 are screen-printed onto the back side (the second major surface 14 of the substrate) and successively dried. The screen printing operations may be carried out in any order. For the sake of production efficiency, all these pastes are typically processed by co-firing them at a temperature in the range of about 700° C. to about 975° C. for a period of from several seconds to several tens of minute in air or an oxygen-containing atmosphere. An infrared-heated belt furnace is conveniently used for high throughput firing.

Figure 1F:
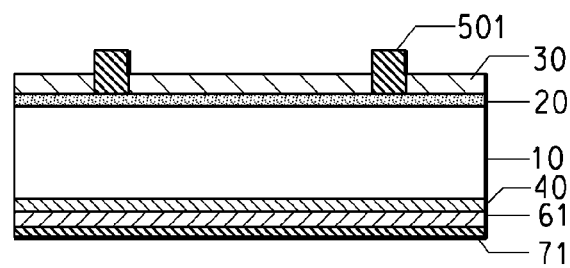

As shown in FIG. 1F, the firing causes the paste composition 500 to sinter and penetrate through the insulating layer 30, thereby achieving electrical contact with the n-type diffusion layer 20, a condition known as "fire through." This fired-through state, i.e., the extent to which the paste melts and passes through the insulating layer 30, depends on the quality and thickness of the insulating layer 30, the composition of the paste, and on the firing conditions. A high-quality fired-through state is believed to be an important factor in obtaining high conversion efficiency in a photovoltaic cell. Firing converts paste 500 into an electrode 501, as shown in FIG. 1F.

The firing further causes aluminum to diffuse from the back-side aluminum paste into the silicon substrate, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. Since there is no need for incoming light to penetrate the back side, substantially the entire surface may be covered. At the same time, because soldering to an aluminum electrode is unfeasible, a silver or silver/aluminum back electrode is formed on limited areas of the backside as an electrode to permit soldered attachment of interconnecting copper ribbon or the like.

On the front side, the front electrode silver paste 500 of the invention is composed of silver, an additive, fusible material, synthetic clay material, and organic medium, and is capable of reacting and penetrating through the silicon nitride layer, 30, during firing to form electrode 501, which provides electrical contact with the n-type layer, 20. This process may be described as "fire through." The quality of the fired-through state, i.e., the extent to which the front electrode silver paste melts and passes through the silicon nitride layer, 30, depends on the quality and thickness of the silicon nitride layer, 30, the composition of the front electrode silver paste, and on the firing conditions. In turn, a high-quality fired-through state is believed to be an important factor in attaining high conversion efficiency of the photovoltaic cell.

While the present invention is not limited by any particular theory of operation, it is believed that, upon firing, the discrete additives, i.e. the synthetic clay and optional etchant additive components, act in concert with the fusible material in the present paste composition to promote etching and rapid digestion of the insulating layer conventionally used on the front side of a photovoltaic cell. Efficient etching in turn permits the formation of a low resistance, front-side electrical contact between the metal(s) of the composition and the underlying substrate.

Ideally, the firing process results in a substantially complete removal of the insulating layer without any substantial disruption of the underlying Si substrate, e.g. by formation of extraneous or unwanted phases in the interface region produced by reaction of the Si substrate with constituents of the paste composition. Surprisingly, fabrication of high efficiency photovoltaic cells is possible using the present paste composition that incorporates synthetic clay and optional etchant additives.

The nature of the fired-through state, i.e., the extent to which the present paste composition, formed as electrode 500, melts and passes through the insulating layer to form electrical contact with the substrate after firing, depends on the quality and thickness of the insulating layer, the composition of the layer and the electrode paste, and the firing conditions. A high-quality fired-through state is believed to be an important factor in obtaining high conversion efficiency in a photovoltaic cell.

It will be understood that the present paste composition and process may also be used to form electrodes, including a front-side electrode, of a photovoltaic cell in which the p- and n-type layers are reversed from the construction shown in FIGS. 1A-1F, so that the substrate is n-type and a p-type material is formed on the front side.

In yet another embodiment, this invention provides a semiconductor device that comprises a semiconductor substrate having a first major surface; an insulating layer optionally present on the first major surface of the substrate; and, disposed on the first major surface, a conductive electrode pattern having a preselected configuration and formed by firing a paste composition as described above.

The device in turn may be incorporated into a photovoltaic cell. Reference numerals as used in FIGS. 1A-1F include the following:

- 10: p-type substrate
- 12: first major surface (front side) of substrate 10
- 14: second major surface (back side) of substrate 10
- 20: n-type diffusion layer
- 30: insulating layer
- 40: p+ layer
- 60: aluminum paste formed on back side
- 61: aluminum back electrode (obtained by firing back side aluminum paste)
- 70: silver or silver/aluminum paste formed on back side
- 71: silver or silver/aluminum back electrode (obtained by firing back side silver paste)
- 500: silver paste formed on front side according to the invention
- 501: silver front electrode according to the invention (formed by firing front side silver paste).

A semiconductor device fabricated as described above may be incorporated into a photovoltaic cell. In another embodiment, this invention thus provides a photovoltaic cell array that includes a plurality of the semiconductor devices as described, and made as described, herein.

EXAMPLES

The operation and effects of certain embodiments of the present invention may be more fully appreciated from a series of examples (Examples 1-5), as described below. The embodiments on which these examples are based are representative only, and the selection of those embodiments to illustrate aspects of the invention does not indicate that materials, components, reactants, conditions, techniques, and/or configurations not described in the examples are not suitable for use herein, or that subject matter not described in the examples is excluded from the scope of the appended claims and equivalents thereof. The significance of the examples is better understood by comparing the results obtained therefrom with the results obtained from certain trial runs that are designed to serve as Control Examples A-B, which provide a basis for such comparison since they do not contain a synthetic clay additive in the conductive paste composition used.

Photovoltaic Cell Fabrication

The performance of photovoltaic cells with front-side conductors made from the present paste composition was evaluated and compared with that of devices made with conventional pastes. For convenience, the fabrication and electrical testing were carried out using 28 mm×28 mm "cut down" wafers prepared by dicing 156 mm×156 mm starting wafers using a diamond wafering saw. The test wafers were screen printed using an AMI-Presco (AMI, North Branch, N.J.) MSP-485 screen printer, first to form a full ground plane back side conductor using a conventional Al-containing paste, Solamet® PV381 (available from DuPont, Wilmington, Del.), and thereafter to form a bus bar and eleven conductor lines at a 0.254 cm pitch on the front surface using the various exemplary pastes herein. Wafers were printed with a bus bar, eleven conductor lines at a 0.254 cm pitch, and a full ground plane screen-printed aluminum back side conductor. After printing and drying, cells were fired in a BTU rapid thermal processing, multi-zone belt furnace (BTU International, North Billerica, Mass.). The firing temperatures reported in the examples are the furnace set-point temperatures for the hottest furnace zone. This temperature was found to be approximately 125° C. greater than the wafer temperature actually attained during the cell's passage through the furnace. After firing, the median conductor line width was 120 µm and the mean line height was 15 µm. The median line resistivity was 3.0 µΩ-cm. Performance of "cut-down" 28 mm×28 mm cells is known to be impacted by edge effects which reduce the overall photovoltaic cell fill factor (FF) by ~5% from what would be obtained with full-size wafers.

Control example photovoltaic cells were prepared using conventional substrates and metallization pastes and with the same printing and firing techniques. In particular, photovoltaic metallization paste sold under the trade name Solamet® PV159 (DuPont Corporation, Wilmington, Del.) was used for the front side electrodes and Solamet®PV381 and Solamet® PV502 tabbing silvers (DuPont Corporation, Wilmington, Del.) were used for the back side electrodes. PV159 has a viscosity (Brookfield HBT, 10 rpm, number 14 spindle, 25° C.) of 190-240 Pa·S. The solids content, determined by firing to 750° C., is 88-90%.

Photovoltaic Cell Electrical Measurements

Photovoltaic cell performance was measured using an ST-1000 IV tester (Telecom STV Co., Moscow, Russia) at 25° C.±1.0° C. The Xe arc lamp in the IV tester simulated the sunlight with a known intensity and irradiated the front surface of the cell. The tester used a four contact method to measure current (I) and voltage (V) at approximately 400 load resistance settings to determine the cell's I-V curve. Photovoltaic cell efficiency (Eff), fill factor (FF), and series resistance ($R_s$) were calculated from the I-V curve. $R_s$ is known to be especially affected by contact resistance ($\rho_c$) and conductor line resistance. Since conductor line resistances were nominally equivalent for the various samples (3.0 $\mu\Omega$-cm), the differences in $R_s$ were regarded as primarily due to $\rho_c$. Ideality factor was determined using the Suns-VOC technique. The ideality factor data herein are reported at a 0.1 sun irradiance level, which is believed to provide a more sensitive indication of diode quality and a more effective measure of p-n junction damage than comparable data taken at a 1.0 sun irradiance level.

Efficiency fill factor, series resistance, and ideality factor values of example photovoltaic cells were compared to corresponding values for photovoltaic cells prepared with industry standard Solamet® PV159 thick film paste composition, which is available from DuPont Corporation, Wilmington, Del.

Control Example A

Photovoltaic cells were manufactured using 160 micron thick Q.Cell multicrystalline silicon wafers (Q-Cells SE, OT Thalheim, Germany). The wafers had been prepared using a POCl$_3$ diffusion process to produce a 65 ohm/sq phosphorus emitter layer and had an acid-etched textured surface. A 70 nm-thick SiN$_x$ antireflective coating had been applied to the front-side major surface using a PECVD process. Front-side electrodes were made using Solamet® PV159, front-side paste composition. A total of 25 samples were screen printed and five samples each were fired at peak temperatures of 870, 890, 910, 930 and 950° C. and then electrically tested. The highest conversion efficiency was seen at a peak firing temperature of 910° C., with a mean efficiency of 14.68% for the five samples.

Control Example B and Examples 1, 2, and 3

Laponite®-RD synthetic clay (available from Southern Clay Products, Gonzales, Tex.) was mixed with a sample of Solamet® PV159 and tested for improved performance in photovoltaic cells. Incorporation of the Laponite®-RD into the PV159 was done by mixing and mulling.

More specifically, mulling was done on either 13 or 25 g paste batches. For the larger batches, the paste was divided in half. A sample of commercial PV159 was weighed into a THINKY jar for a Thinky mixer (THINKY ARE-250, Thinky Corporation, Japan) and mixed. Laponite-RD additive was weighed on wax paper and then added to the THINKY jar. The relative concentration of Laponite-RD for Examples 1, 2, and 3 was 0.25, 0.50 and 0.75% by total weight, respectively. The contents of the Thinky jar were mixed for a second time to incorporate the Laponite-RD.

Samples were mulled using a Hoover Automatic Muller (Model M5, Hoover Color Corporation, Hiwasse, Va.). The mulling procedure included three cycles, each consisting of 30 rotations in 30 sec. Prior to each cycle, the paste was applied to the bottom or top plate, the top plate was pulled down to the bottom plate and the weight was engaged. After the cycle ended, the weights were disengaged, the plates were pulled apart, and a squeegee was used to reapply the mulled paste to the plate opposite the one previously used (i.e. typical schedule: cycle one: bottom, cycle two: top, cycle three: bottom). Pressurized air and lint free towels were used to clean the muller both before and after use. Between each reapplication of paste, the squeegee was cleaned with isopropanol to remove unmulled paste.

A sample for Control Example B was made by subjecting the same PV159 paste in its as-received condition and without any Laponite addition to the foregoing mixing and mulling operations. This zero percent concentration sample provided a second control to determine the effect, if any, of the additional mixing and mulling operations done for Examples 1-3, relative to the performance of commercial PV159 in Control Example A.

The viscosity of the samples was adjusted to about 180 Pas at 10 rpm by adding Texanol solvent and mixing in a Thinky mixer. The compositions prepared and their final viscosities are provided in Table I below.

The pastes for Control Example B and Examples 1-3 were screen printed onto Q.Cells 65 ohm/sq, 160 μm wafers (Q-Cells SE, 06766 Bitterfeld-Wolfen, Germany) using nominal process settings that had been determined to be suitable for unmodified commercial PV159 paste. In particular, the pastes were screen printed using a flood mode with a 325 mesh screen having eleven 100 micron lines oriented 30 degrees to the screen and a 1.2 mil emulsion. In accordance with conventional practice, minor adjustments in the conditions were made to maintain consistent application as the printing of the samples progressed.

Five parts of each sample were fired at 870, 890, 910, 930 and 950° C. The photovoltaic efficiencies of the samples were found to be optimal at the 910° C. firing temperature. The mean efficiency for each set of samples is shown in Table I. It is to be noted that the samples of Example 1 (0.25% Laponite) exhibited a mean efficiency of 15.03%, more than 0.3% better than the 14.69% efficiency of Control Example B made with mulled, but otherwise unmodified PV159 paste, demonstrating the benefit of including a synthetic clay additive in the present paste composition. Higher additive concentrations resulted in efficiencies that were slightly lower, but still acceptable, as seen in the values for the 0.50 and 0.75% samples of Examples 2-3.

The additional mulling operation done for Control Example B had little or no demonstrable effect, as its 14.69% mean efficiency was virtually identical to the 14.68% of Control Example A, which was made with commercial PV159 which was not further processed.

TABLE I

Paste Compositions and Electrical Performance
of Photovoltaic Cells Prepared Therewith

| Example | Laponite ® RD (wt. %) | Paste Viscosity (Pa·s) | Mean Efficiency (%) |
|---|---|---|---|
| Control B | 0 | 176 | 14.69 |
| 1 | 0.25 | 187 | 15.03 |
| 2 | 0.50 | 187 | 14.54 |
| 3 | 0.75 | 175 | 13.88 |

Examples 4 and 5

The effect on photovoltaic cell performance of adding Laponite-RD to a front-side metallization paste was characterized. For Examples 4 and 5, Laponite-RD was incorporated at 0.25% and 0.50% by weight respectively into commercial DuPont PV159 paste by mixing and mulling in the manner described for Examples 1-3. Thereafter, Texanol solvent was added and mixed in each sample to adjust its viscosity to a target of about 260 Pa's at 10 rpm. The measured final viscosities for Examples 4 and 5 were 251 and 284 Pa·s, respectively.

Photovoltaic cells were then constructed and tested as before using the Laponite-modified paste compositions. The pastes were screen printed on Deutsche Cells wafers (Deutsche Cell GmbH, Freiberg, Germany) using a flood mode with a 325 mesh screen having 11 100 micron lines oriented 30 degrees to the screen and a 1.2 mil emulsion. The pastes were printed with a down stop of 7.39. Five parts of each sample were fired at 870, 890, 910, 930 and 950° C. The highest mean efficiencies were obtained at the 910° C. firing temperature. As set forth in Table II, the mean efficiency for Examples 4 and 5 were 14.99% and 15.04%. Both were successively better than the respective 14.68% and 14.69% mean efficiencies of the PV159 Control Examples A and B, showing improvement resulting from the Laponite addition, although the optimal concentration of Laponite-RD was not determined.

TABLE II

Paste Compositions and Electrical Performance
of Photovoltaic Cells Prepared Therewith

| Example | Laponite ® RD (wt. %) | Paste Viscosity (Pa·s) | Mean Efficiency (%) |
|---|---|---|---|
| Control C | 0 | — | 14.83 |
| 4 | 0.25 | 251 | 14.99 |
| 5 | 0.50 | 284 | 15.04 |

Having thus described the invention in rather full detail, it will be understood that this detail need not be strictly adhered to but that further changes and modifications may suggest themselves to one skilled in the art, all falling within the scope of the invention as defined by the subjoined claims

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range In this specification, unless explicitly stated otherwise or indicated to the contrary by the context of usage, (a) amounts, sizes, ranges, formulations, parameters, and other quantities and characteristics recited herein, particularly when modified by the term "about", may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value; and (b) all numerical quantities of parts, percentage, or ratio are given as parts, percentage, or ratio by weight; the stated parts, percentage, or ratio by weight may or may not add up to 100.

What is claimed is:

1. A paste composition comprising in admixture:
    a) about 70 to 96% by weight based on solids of electrically conductive silver metal powder;
    b) about 0.1 to 15% by weight based on solids of a fusible material;
    c) about 0.1 to 2% by weight based on solids of a nanoscale synthetic clay additive;
    d) 0 to about 15% by weight based on solids of one or more etchant additives; and
    e) an organic medium.

2. The paste composition of claim 1, wherein the electrically conductive silver metal powder is present in an amount of about 80 to 95% by weight based on solids.

3. The paste composition of claim 1, wherein the fusible material is present in an amount of about 2 to 8% by weight based on solids.

4. The paste composition of claim 1, wherein the synthetic clay additive is a synthetic smectite.

5. The paste composition of claim 4, wherein the synthetic clay additive is a layered hydrous magnesium lithium silicate comprising particles of a compound having the empirical chemical formula:

$$Na^+_{0.7}[(Si_8Mg_{5.5}Li_{0.3})O_{20}(OH)_4]^{-0.7},$$

and in which at least a portion of the hydroxyl groups are substituted by fluorine.

6. The paste composition of claim 4, wherein the synthetic clay additive is a layered hydrous magnesium lithium silicate comprising particles of a compound having the empirical chemical formula:

$$Na^+_{0.7}[(Si_8Mg_{5.5}Li_{0.3})O_{20}(OH)_4]^{-0.7},$$

the particles of the silicate having surfaces that are modified by inclusion thereon of an alkali metal pyrophosphate.

7. The paste composition of claim 4, wherein the synthetic clay additive is a layered hydrous magnesium lithium silicate comprising particles of a compound having the empirical formula:

$$Na^+_{0.7}[(Si_8Mg_{5.5}Li_{0.3})O_{20}(OH)_4]^{-0.7}.$$

8. The paste composition of claim 1, wherein the synthetic clay additive comprises particles having an average diameter in the range of 10 to 40 nm and an average thickness in the range of 0.5 to 2.0 nm.

9. The paste composition of claim 1, wherein the synthetic clay additive is present in an amount of about 0.1 to 1% by weight based on solids.

10. The paste composition of claim 1, wherein the etchant additive comprises at least one of a metal, a metal oxide, a precursor compound, or a mixture thereof, and wherein: (a) the metal is at least one of Zn, Li, Ag, Mg, Gd, Ce, Zr, Ti, Mn, Sn, Ru, Co, Fe, Cu, or Cr, or an alloy or mixture thereof; (b) the metal oxide is an oxide of one or more of the metals of (a); and (c) the precursor compound is a substance adapted to react to form a metal of (a) or a metal oxide of (b) upon firing.

11. The paste composition of claim 10, wherein the etchant additive comprises at least one of zinc oxide, zinc metal, lithium carbonate, lithium oxide, lithium phosphate, or a mixture thereof.

* * * * *